(12) United States Patent
Belyansky et al.

(10) Patent No.: US 6,977,194 B2
(45) Date of Patent: Dec. 20, 2005

(54) STRUCTURE AND METHOD TO IMPROVE CHANNEL MOBILITY BY GATE ELECTRODE STRESS MODIFICATION

(75) Inventors: Michael P. Belyansky, Bethel, CT (US); Dureseti Chidambarrao, Weston, CT (US); Omer H. Dokumaci, Wappingers Falls, NY (US); Bruce B. Doris, Brewster, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/695,752

(22) Filed: Oct. 30, 2003

(65) Prior Publication Data

US 2005/0093059 A1    May 5, 2005

(51) Int. Cl.$^7$ ............................................. H01L 29/72
(52) U.S. Cl. .................. 438/197; 438/199; 257/257; 257/369
(58) Field of Search ................. 257/257, 369, 257/370; 438/197

(56) References Cited

U.S. PATENT DOCUMENTS

2004/0075148 A1 *    4/2004    Kumagai et al. ........... 257/369

* cited by examiner

*Primary Examiner*—Edward Wojciechowicz
(74) *Attorney, Agent, or Firm*—Whitham, Curtis & Christofferson, P.C.; Ira D. Blecker

(57) ABSTRACT

In producing complementary sets of metal-oxide-semiconductor (CMOS) field effect transistors, including nFET and pFET), carrier mobility is enhanced or otherwise regulated through the reacting the material of the gate electrode with a metal to produce a stressed alloy (preferably $CoSi_2$, NiSi, or PdSi) within a transistor gate. In the case of both the nFET and pFET, the inherent stress of the respective alloy results in an opposite stress on the channel of respective transistor. By maintaining opposite stresses in the nFET and pFET alloys or silicides, both types of transistors on a single chip or substrate can achieve an enhanced carrier mobility, thereby improving the performance of CMOS devices and integrated circuits.

5 Claims, 9 Drawing Sheets

STRUCTURE AND METHOD TO IMPROVE CHANNEL MOBILITY BY GATE ELECTRODE STRESS MODIFICATION

BACKGROUND OF THE INVENTION

1. Field of the Invention

The present invention generally relates to the manufacture of transistors for integrated circuits and, more particularly, to the production of complementary pairs of field effect transistors of enhanced performance at extremely small scale.

2. Description of the Prior Art

Performance and economic factors of integrated circuit design and manufacture have caused the scale of elements (e.g. transistors, capacitors and the like) of integrated circuits to be drastically reduced in size and increased in proximity on a chip. That is, increased integration density and proximity of elements reduces the signal propagation path length and reduces signal propagation time and susceptibility to noise and increase of possible clock rates while the reduction in element size necessary for increased integration density increases the ratio of functionality which can be provided on a chip to the costs of production (e.g. wafer/chip area and process materials) per chip and, potentially, the cost of devices containing the chips by reducing the number of inter-chip and inter-board connections required as the goal of a system-on-a-chip is approached.

However, the immutable material properties and physical effects by which transistors and other elements function is invariably compromised as the scale of integrated circuit elements is reduced. In response, many improvements in transistor design have been made to maintain suitable levels of performance of these elements. For example, lightly doped drain (LDD) structures (now generally referred to as extension implants since heavier doping levels have been required in current minimum feature size regimes), halo implants and graded impurity profiles have been employed to counteract short channel and punch-through effects and the like, particularly in field effect transistors (FETs) which have become the active device of choice for all but the highest frequency devices. Reduction in device scale has also required operation at reduced voltages to maintain adequate performance without device damage even though operating margins may be reduced.

A principal factor in maintaining adequate performance in field effect transistors is carrier mobility which affects the amount current or charge which may flow (as electrons or holes) in a doped semiconductor channel under control of a voltage placed on a gate electrode insulated from the channel by a very thin dielectric. Reduced carrier mobility in an FET reduces not only the switching speed/slew rate of a given transistor but also reduces the difference between "on" resistance to "off" resistance. This latter effect increases susceptibility to noise and reduces the number of and/or speed at which downstream transistor gates (capacitive loads) can be driven. Even during the early development of metal-oxide-semiconductor (MOS) field effect transistors and complementary MOS (CMOS) devices (widely used in integrated circuits at the present time), in particular, carrier mobility was a design concern and often required a pMOS device to be made several times as large as a complementary nMOS device with which it was paired in order to obtain reasonably symmetrical operation of the CMOS pair in view of the difference in carrier mobility between electrons, the principal carrier in nMOS devices and holes, the principal carrier in pMOS devices. In more recent and critical designs, it has been shown that carrier mobility degrades in deeply scaled bulk MOS devices due to the heavy doping required to suppress short-channel effects and ultra-thin oxide effects.

It has also been shown theoretically and confirmed experimentally that mechanical stress in the channel region of an FET can increase or decrease carrier mobility significantly; depending on the sign of the stress (e.g. tensile or compressive) and the carrier type (e.g. electron or hole). Tensile stress increases electron mobility and decreases hole mobility while compressive stress increases hole mobility while decreasing electron mobility in the doped semiconductor crystal lattice forming the transistor channel. This phenomenon is well-recognized and theories concerning the physical effects by which it occurs are, in any event, unimportant to its exploitation. In this regard, numerous structures and materials have been proposed for inducing tensile or compressive force in a semiconductor material, such as shallow trench isolation (STI) structures, gate spacers, etch-stop layers and silicide which are generally included in integrated circuit designs. Prior art methods to strain Si channels include using SiGe which imparts stress from the bottom of the channel, while methods using STI materials and SiN etch stop layers impart longitudinal stress from the sides.

However, there are issues, well known to those skilled in the art, regarding the SiGe buffer layer or implanted-anneal-buffer approach with a strained Si cap, including dislocations that impact yield severely along with significant trouble containing arsenic diffusion enhancements, cost, and excessive complexity. The STI approach is less costly but is not self-aligned to the gate and has external resistance (RX) size sensitivity. The approach of using nitride etch stop layers to create stress (while worth pursuing only because it is relatively inexpensive) does give some benefit, but the gain is relatively marginal.

Further, at the present state of the art, such structures can generally be made of only one type; to produce tensile stress or compressive stress but not both. Therefore, in integrated circuit designs using both pFET and nFET transistors and CMOS technology (in which the logic is implemented principally by complementary pMOS and nMOS transistor pairs), in particular, an enhancement of carrier mobility on one type of transistor was necessarily accompanied by degradation of carrier mobility in the other or complementary type of transistor; yielding little, if any, net performance gain although theoretically usable to improve symmetry of operation of a CMOS pair. Moreover, stress of a single type produced by such structures and/or over many areas which may exceed transistor size tends to cause warping or curling of the wafer or substrate which compromises later lithographic processes such as the formation of contacts and connections or, in severe cases, chip or wafer cracking; reducing manufacturing yield or (in rare cases) reliability after being put into service. Further, the stress levels produced by such structures were generally difficult to control particularly since the structure dimensions are often dictated by other design concerns, such as isolation and breakdown voltages. Further, such structures may present severe topography on the surface of a chip or wafer which may compromise subsequent manufacturing processes.

SUMMARY OF THE INVENTION

It is therefore an object of the present invention to provide a method and structure which can provide tensile and compressive stresses on different electronic element structures on the same chip or wafer.

It is another object of the invention to provide a method and structure which can be easily and repeatably formed with high manufacturing yield which does not adversely affect the chip or wafer or earlier- or later-conducted manufacturing processes in which tensile and compressive stress levels may be readily controlled.

It is yet another object of the invention to provide a method and structure which can be relatively free from warping as a result of multiple opposing stresses being alternately applied across a substrate with a net distortion nearing zero.

In order to accomplish these and other objects of the invention, a method of adjusting carrier mobility in semiconductor devices is provided comprising the steps of depositing a metal or combination of metals to contact either the first or second transistor gate structure, and alloying the metal with the transistor gate structure to form a first stressed silicide within the transistor gate. A first stress is created within the channel of the selected transistor without producing a stress in the channel of the other transistor. Likewise, a second stressed silicide may be formed in the other transistor to provide stress in its channel, but that does not effect the stress on the channel within the first transistor.

In accordance with another object of the invention an apparatus is provided that adjusts carrier mobility in semiconductor devices comprising a substrate, a first and second transistor each having a gate dielectric, gate electrode, and source, drain, and gate regions, formed on said substrate, a first stressed silicide gate providing tensile stress at least in one channel of first transistor and a second stressed silicide providing compressive stress at least in one channel of second transistor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

It should be appreciated in the course of the following discussion of FIGS. 1–12 that the embodiment which will be described is that which is expected to be the most advantageous in most applications and integrated circuits designs and thus allow the most complete appreciation and understanding of the invention to be conveyed. That is, the embodiment and variants thereof which will be described below will illustrate application of variable amounts of tensile and compressive stresses to respective adjacent transistors on a single chip and provide enhancement or other regulation of carrier mobility. However, the principles of the invention described in connection with this embodiment can also be applied to provide any desired amount of stress of either sign to adjacent transistors in any design and for any purpose.

Figure 1A:
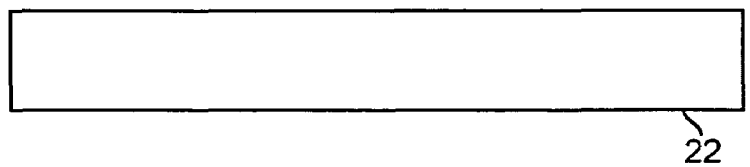
FIGS. 1a, 1b, and 1c provide a cross-sectional view of the progression of the first steps in creating the CMOS transistor including the initial Si substrate (FIG. 1a), forming device isolation (FIG. 1b), and gate oxidation (FIG. 1c).
Figure 1B:
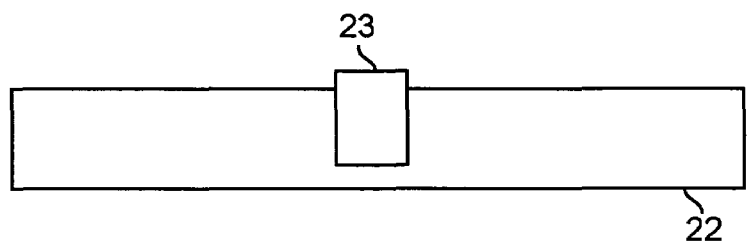
Figure 1C:
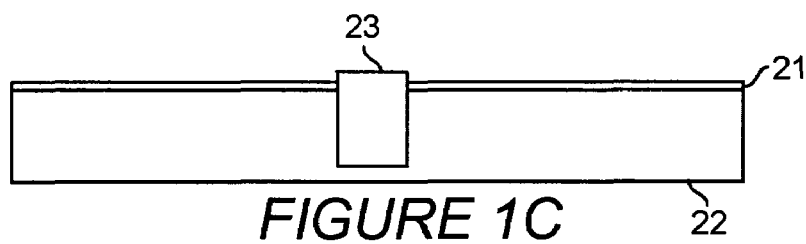
Figure 2:
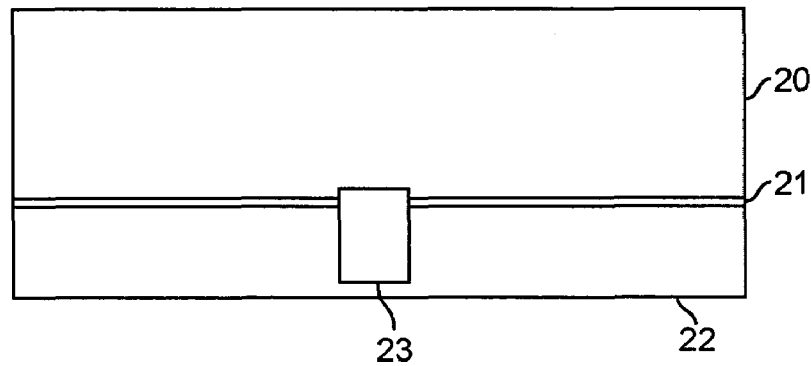
FIG. 2 is a cross-sectional view of the second step in creating the CMOS transistor comprising the deposit of gate electrode material.
Figure 3:
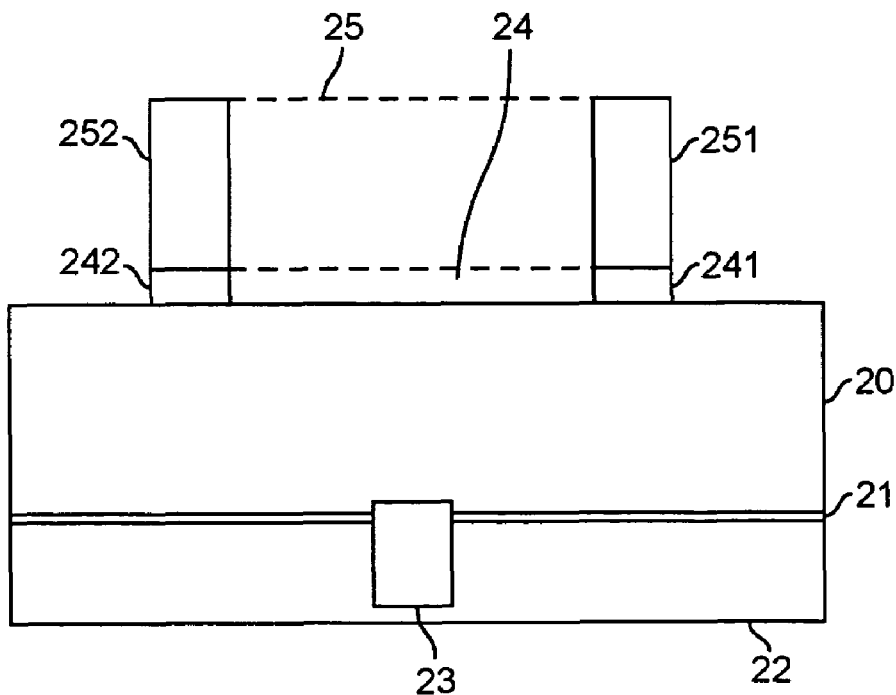
FIG. 3 is a cross-sectional view of the third step in creating the CMOS transistor comprising the application of a hard mask, a photo-resist and the patterning of said photo-resist.

Referring now to the drawings, and more particularly to FIGS. 1a, 1b, and 1c, the first stages in making the preferred embodiment of the invention are shown including a prepared substrate 22 (e.g. Si, strained Si, SiGe, Ge, SOI, or any other semiconductor substrate), the formation of an isolation device 23 such as shallow trench isolation (STI) on said substrate 22 serving to define n-well and p-well regions of the substrate 22, followed by the formation of an oxidized layer 21 over the substrate to later be formed into gate dielectrics. Following oxidation, a semiconductor material 20 (e.g. silicon or germanium) suitable for forming gate electrodes is deposited across the entire wafer, as illustrated in FIG. 2. This material 20, as illustrated in FIG. 3, is covered with a hard mask material 24 followed by a photo-resist layer 25. The photo-resist 25 is patterned into at least two sections 251, 252 directly over the desired pFET and nFET gate electrode areas. The photo-resist sections 251/252 are then used to remove exposed areas of the hard mask into at least two sections 241/242 of the same planar dimensions as the photo-resist sections 251/252.

Figure 4:
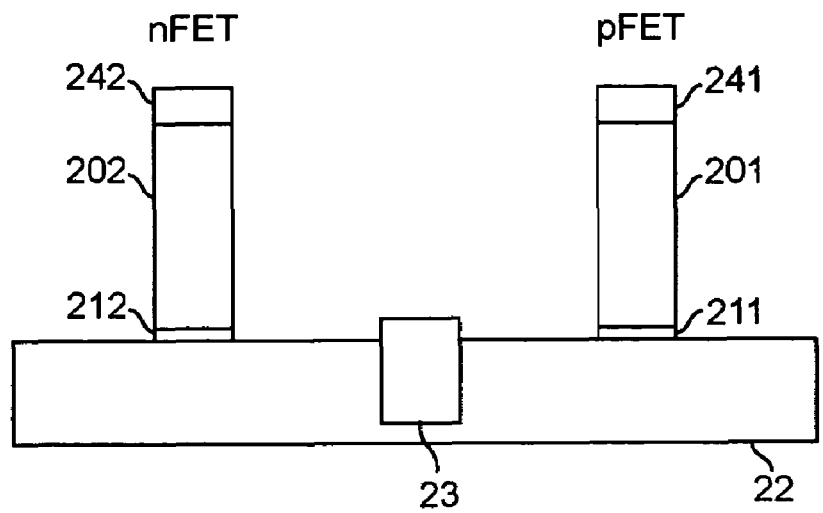
FIG. 4 is a cross-sectional view of the fourth step in creating the CMOS transistor comprising the removal of said photo-resist and etching the gate stack material.

Referring now to FIG. 4, the photo-resist 25 is removed after patterning the hard mask 24 and the material 20 and the gate oxide are etched into at least two separate gate stacks defining the nFET and pFET on the substrate 22 each respectively comprising a thin layer of the remaining gate oxide 212/211, a gate electrode 202/201, and a hard mask 242/241.

Figure 5:
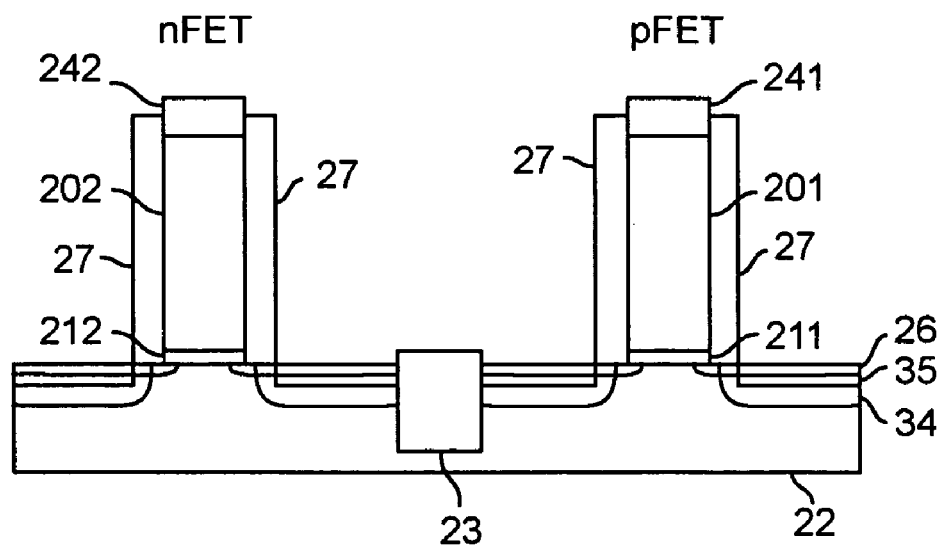
FIG. 5 is a cross-sectional view of the fifth step in creating the CMOS transistor comprising the implantation of extensions, the creation of spacers, followed by the source drain implants, followed by junction anneal and silicide.

Following the creation of the gates, extensions 26 are implanted, spacers 27 are formed, and followed by source/drain implants 34, followed by junction anneal and silicide or alloy of other semiconductor material (sometimes collectively referred to as "silicide" even when no silicon is included) 35 formation and impurity diffusion to the locations, as illustrated in FIG. 5.

Figure 6:
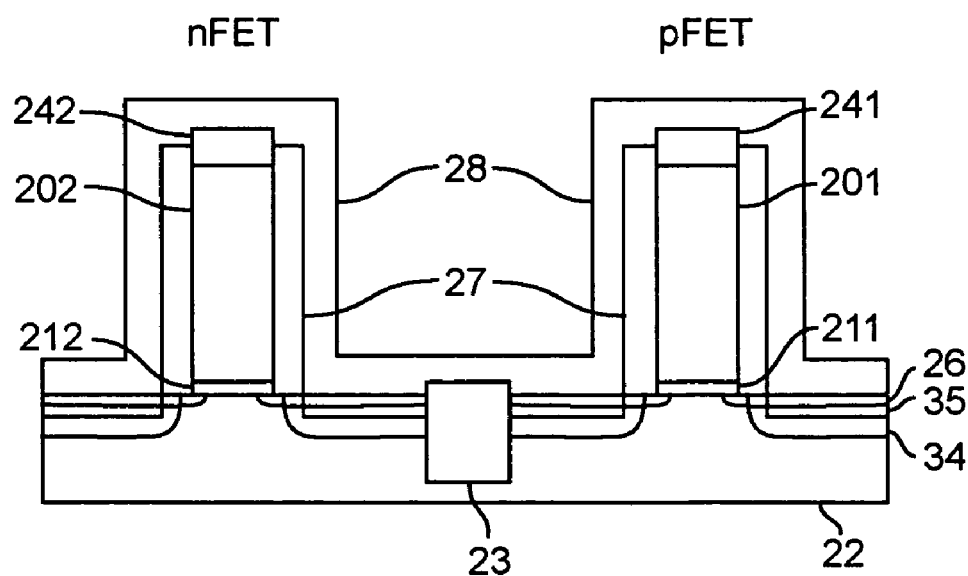
FIG. 6 is a cross-sectional view of the sixth step in creating the CMOS transistor comprising the deposit of an SiN liner.
Figure 7:
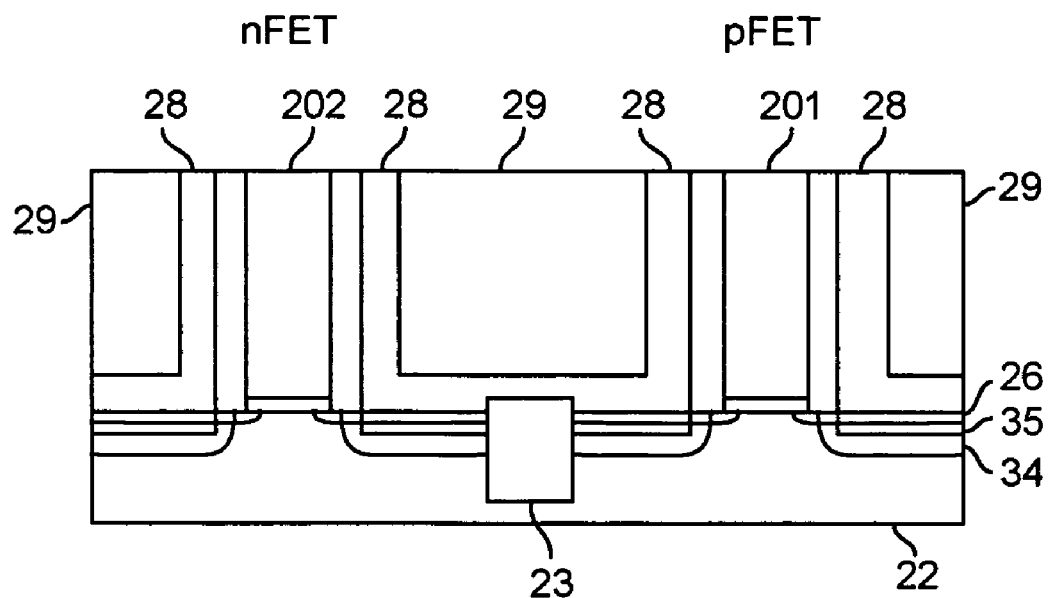
FIG. 7 is a cross-sectional view of the seventh step in creating the CMOS transistor comprising the deposit of an oxide film followed by CMP to the top of the gate stack.

An SiN liner 28 is applied to the entire wafer, as illustrated in FIG. 6. An oxide film 29 is then deposited, followed by CMP to the top of the gate stack, thereby creating a planar surface across the entire wafer at the top of the gates, removing the hard masks 242/241 as illustrated in FIG. 7.

Figure 8:
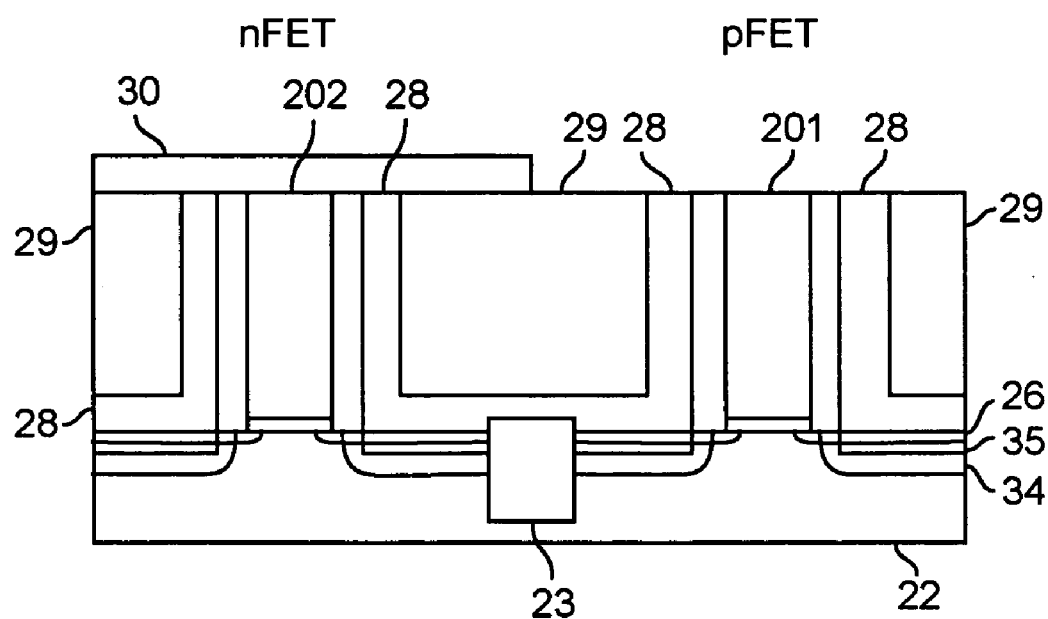
FIG. 8 is a cross-sectional view of the eighth step in creating the CMOS transistor comprising the patterning of an oxide or nitride film using photolithography and etch process to block the nFET regions during pFET silicidation.

Referring now to FIG. 8, an intermediate structure is shown in which an oxide or nitride film 30 is patterned using a photolithography and etch process to block the nFET regions to prepare for pFET silicidation.

Figure 9:
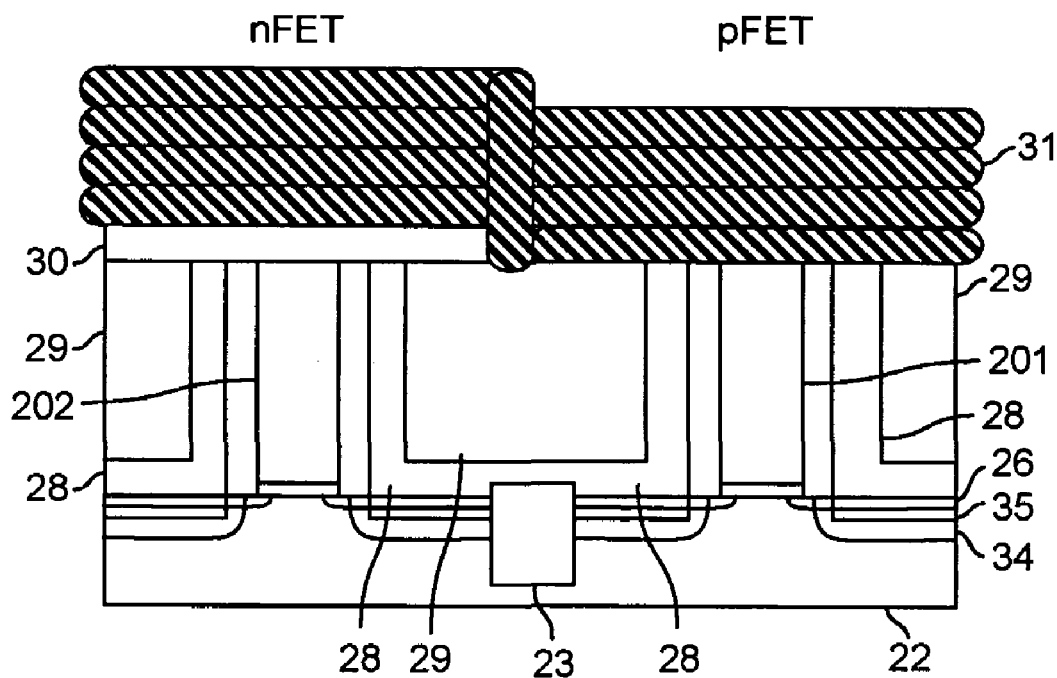
FIG. 9 is a cross-sectional view of the ninth step in creating the CMOS transistor comprising the deposit of metal to the top of the wafer to form the tensile silicide.

Next, as illustrated in FIG. 9, a metal 31 to form the tensile alloy or silicide (e.g. $CoSi_2$) is deposited on the entire wafer. The tensile silicide forms in the gate area 201 as the gate material 20 reacts with the metal 31. Tensile silicide is desired in the gate of the pFET so that it creates compressive stress within the channel 341, a condition which increases hole mobility, thereby enhancing performance.

Figure 10:
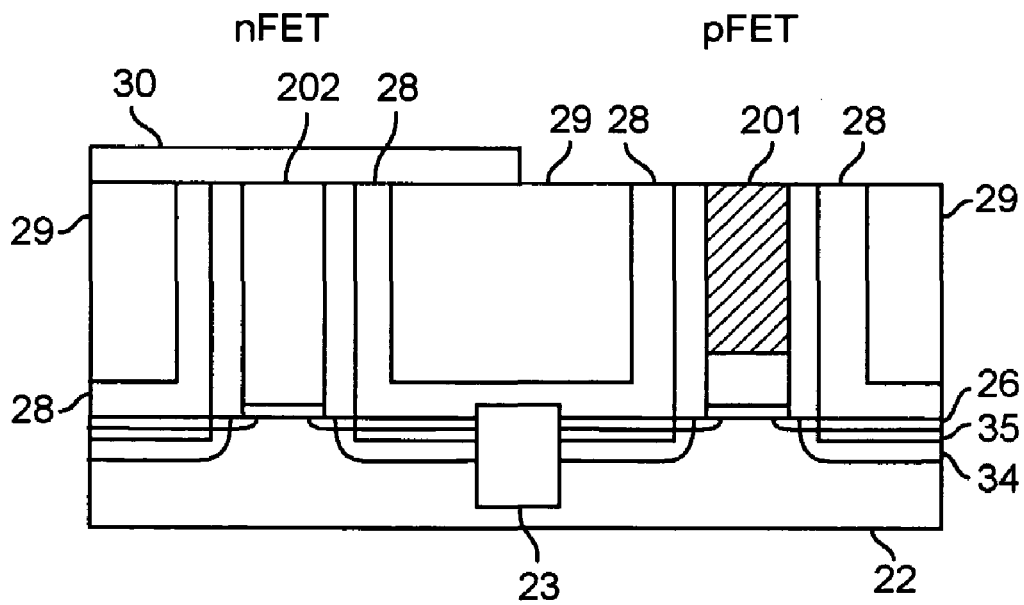
FIG. 10 is a cross-sectional view of the tenth step in creating the CMOS transistor comprising the reaction of first silicide with applied metal using a standard RTA process and the removal of excess unreacted metal.
Figure 11:
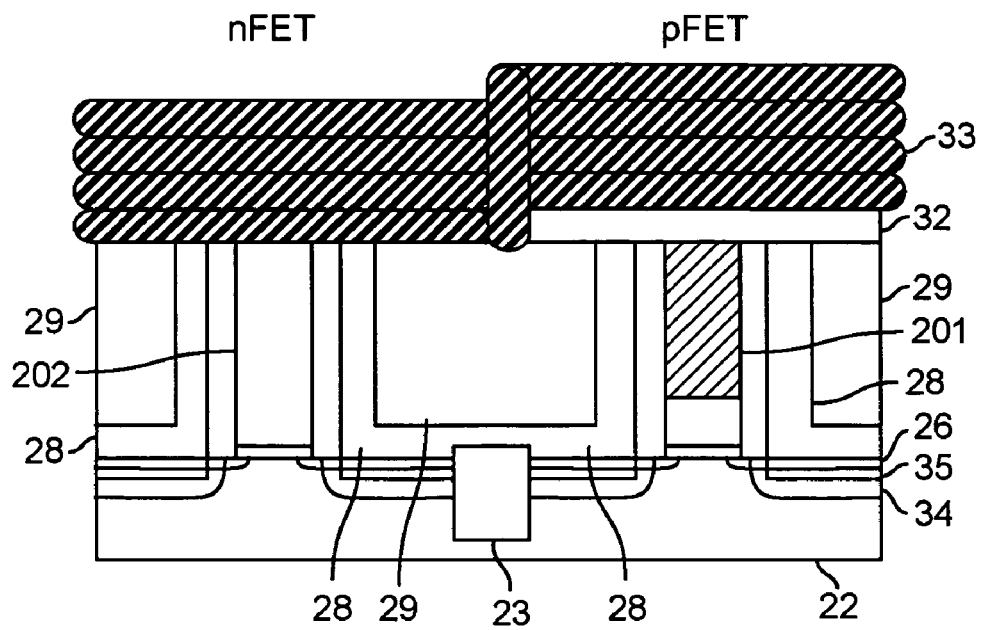
FIG. 11 is a cross-sectional view of the eleventh step in creating the CMOS transistor comprising the removal of the nFET blocking layer using a dry or wet etching process and the application of a pFET blocking layer and the application of metal making contact with the nFET gate.

This first alloy or silicide 201 (hereinafter sometimes simply "silicide", as is preferred, although the invention can be practiced with other semiconductor materials) is reacted using, for example a standard RTA process, after which the excess unreacted metal is removed as shown in FIG. 10. The blocking layer 30 is then removed from over the nFET and a new blocking layer 32 is positioned over the pFET region allowing another metal 33 to only contact the nFET gate 202 when applied, as illustrated in FIG. 11.

As with the first silicide, the second silicide is formed using, for example, a conventional RTA process. On contact with the nFET gate, the second alloy or silicide (exhibiting compressive properties) is formed. It is desirable for the nFET gate to exhibit compressive properties in order to apply a tensile stress to the nFET channel 342. Tensile stress on the nFET channel 342 is known to increase electron mobility and enhance nFET performance.

Figure 12:
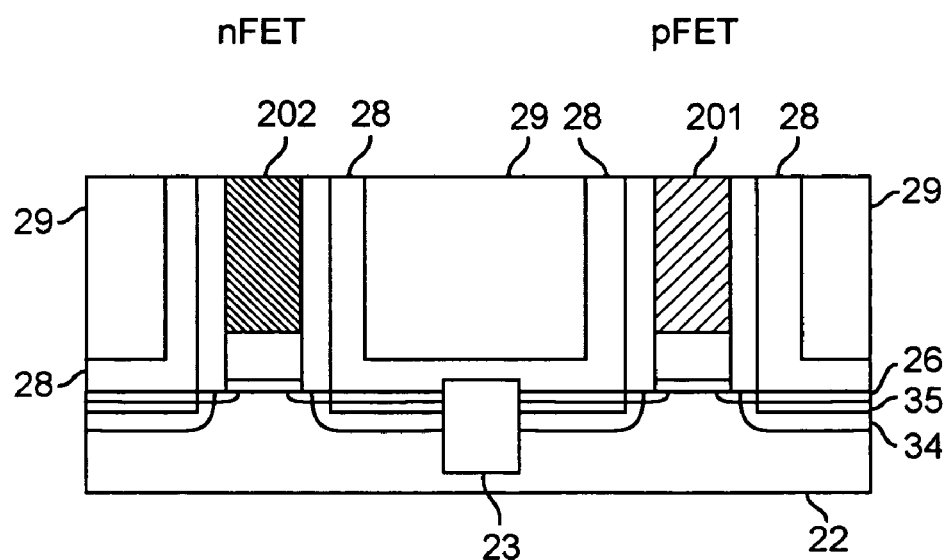
FIG. 12 is a cross-sectional view of the twelfth step in creating the CMOS transistor comprising the forming of the second silicide using a conventional RTA process followed by the removal of the unreacted metal and the pFET blocking layer, the final preferred embodiment is shown.

The unreacted metal and the blocking layer 32 over the pFET are removed to result in the final configuration of a preferred embodiment of the invention, illustrated in FIG. 12 which may be completed with connections, passivation layer and the like in a known manner.

It is important to observe that, as illustrated, neither the tensile silicide 201 nor the compressive silicide 202 reach their respective channels 341, 342. This unreacted Si (preferably of about 100 Å thickness) within the gate area is in place to avoid a change of work function and threshold and possible effects on gate oxide integrity. This process is regulated by precise measurements of poly thickness and a precisely deposited thickness of metal so that reacted silicide does not contact the Si located in the channel. Precise temperature control is also used in creating the desired reaction and silicide location.

It is known that $CoSi_2$ films are extremely tensile while NiSi is much less tensile and PdSi is extremely compressive. Similar effects are known for other alloys (e.g. of Ge or SiGe). This invention utilizes these alloy or silicide properties specifically to achieve a desired degree of electron and hole mobility by forming a structure and method of imparting compressive stress to the pFET channel while preventing compressive stress from being imparted to the nFET channel, and vice versa through choice of metal(s) for formation of the silicide. Any combination of these silicides and thicknesses may be used to optimize stress and therefore carrier mobility in the respective transistor channels as well as the work function of the gate to achieve a desired switching threshold. For example, it may be useful to form the gate with a combination of NiSi or $CoSi_2$ for the bottom portion of the gate stack (proximate to the channel) and PdSi for the top portion of the gate electrode. This can be accomplished by recessing the poly Si gate 201 or 202, forming the NiSi or $CoSi_2$ and then depositing more poly Si, performing CMP and then reacting the Pd to form PdSi. One main advantage of this is that if the gate is completely silicided, or nearly so, then the silicide closest to the channel region can be used to engineer the work function of the gate while the silicide on the top part of the gate can be used to engineer the channel stress. This is made possible by using a very thin first silicide layer and a much thicker second silicide layer to impart the channel stress. Hole and electron carrier mobility may thus be enhanced or regulated to any desired degree within the range of effects of tensile and compressive forces thereon available from the silicide while allowing full freedom of gate work function design.

Figure 13:
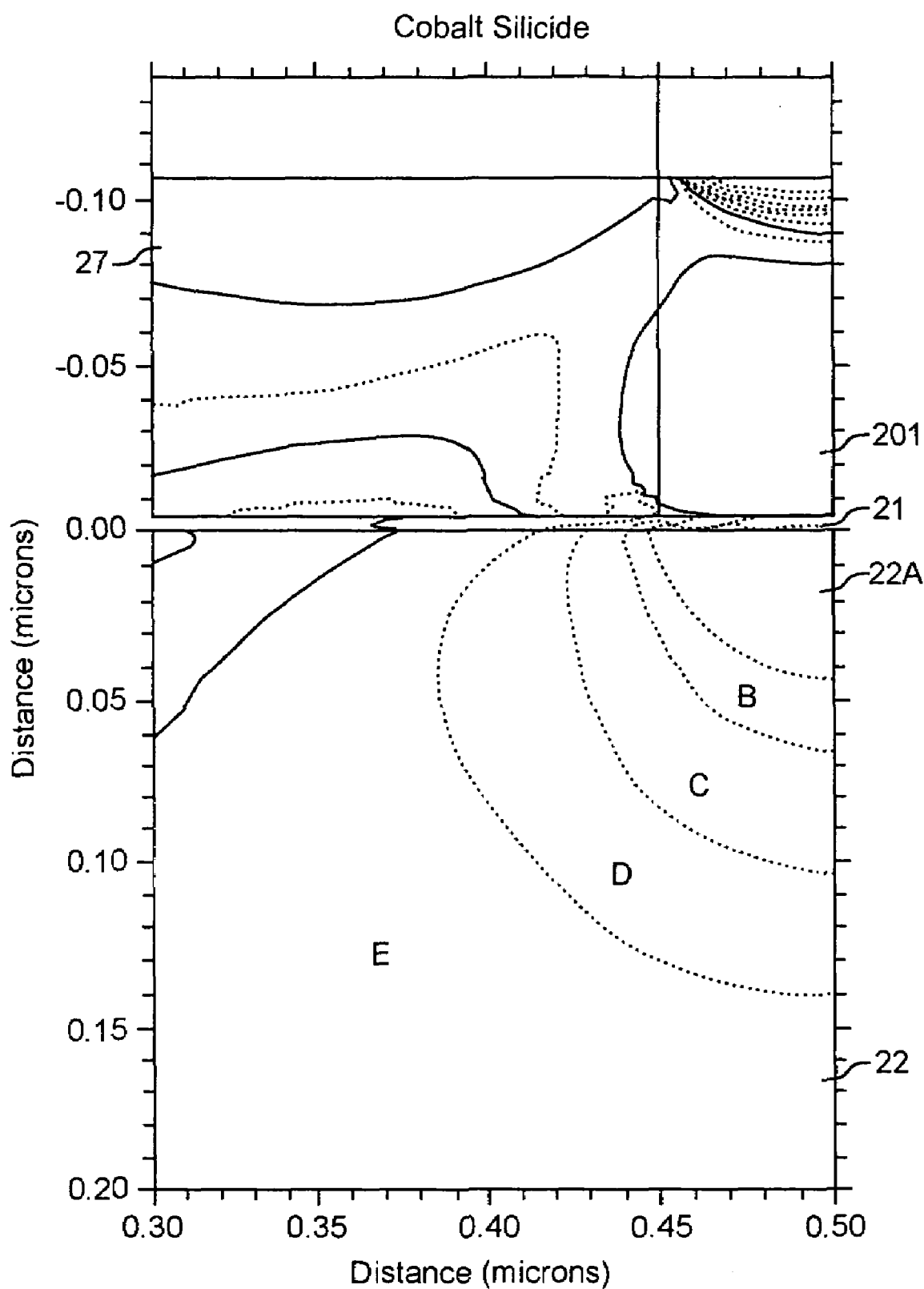
FIG. 13 is a cross-sectional depiction of the compressive and tensile stresses created in the substrate and gate area using a cobalt silicide ($CoSi_2$) gate structure.

FIG. 13 illustrates the contours for stress in the CoSi gate stack (located in the pFET gate) using dashed lines to illustrate the distribution of compressive stress and solid lines to illustrate the distribution of tensile stress. The stresses are displayed over a cross-sectional view of the channel area 341 located directly beneath the $CoSi_2$ gate 201. The extremely tensile $CoSi_2$ gate expands significantly providing the source of all the stress patterns shown, and resulting in a highly compressive condition within the channel region of the substrate 22a. The compressive stress is the strongest in substrate region 22a and lessens as the stress fans out to substrate area 22e. The sign of the stress is changed abruptly at the gate edge.

Figure 14:
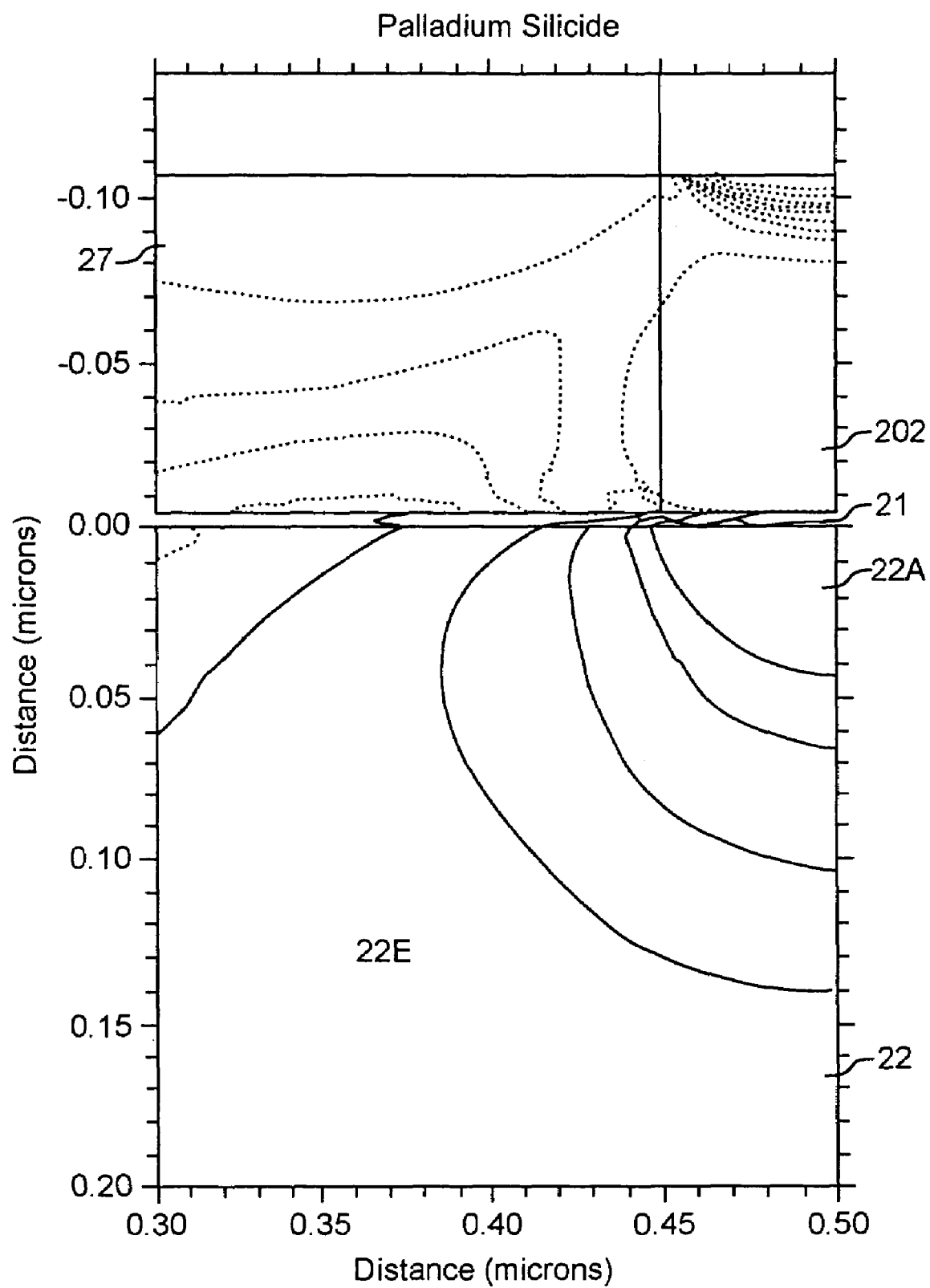
FIG. 14 is a cross-sectional depiction of the compressive and tensile stresses created in the substrate and gate area using a palladium silicide gate structure.

FIG. 14 illustrates the contours for stress in the PdSi gate stack (located in the nFET gate) using dashed lines to illustrate the distribution of compressive stress and solid lines to illustrate the distribution of tensile stress. The graphical stresses are displayed over a cross-sectional view of the channel area 342 located directly beneath the PdSi gate 202. The extremely compressive PdSi gate contracts significantly providing the source of all the stress patterns shown, and resulting in a highly tensile condition within the channel region of the substrate 22a. The tensile stress is the strongest in substrate region 22a at the gate edge and lessens as the stress fans out to substrate area 22e.

Figure 15:
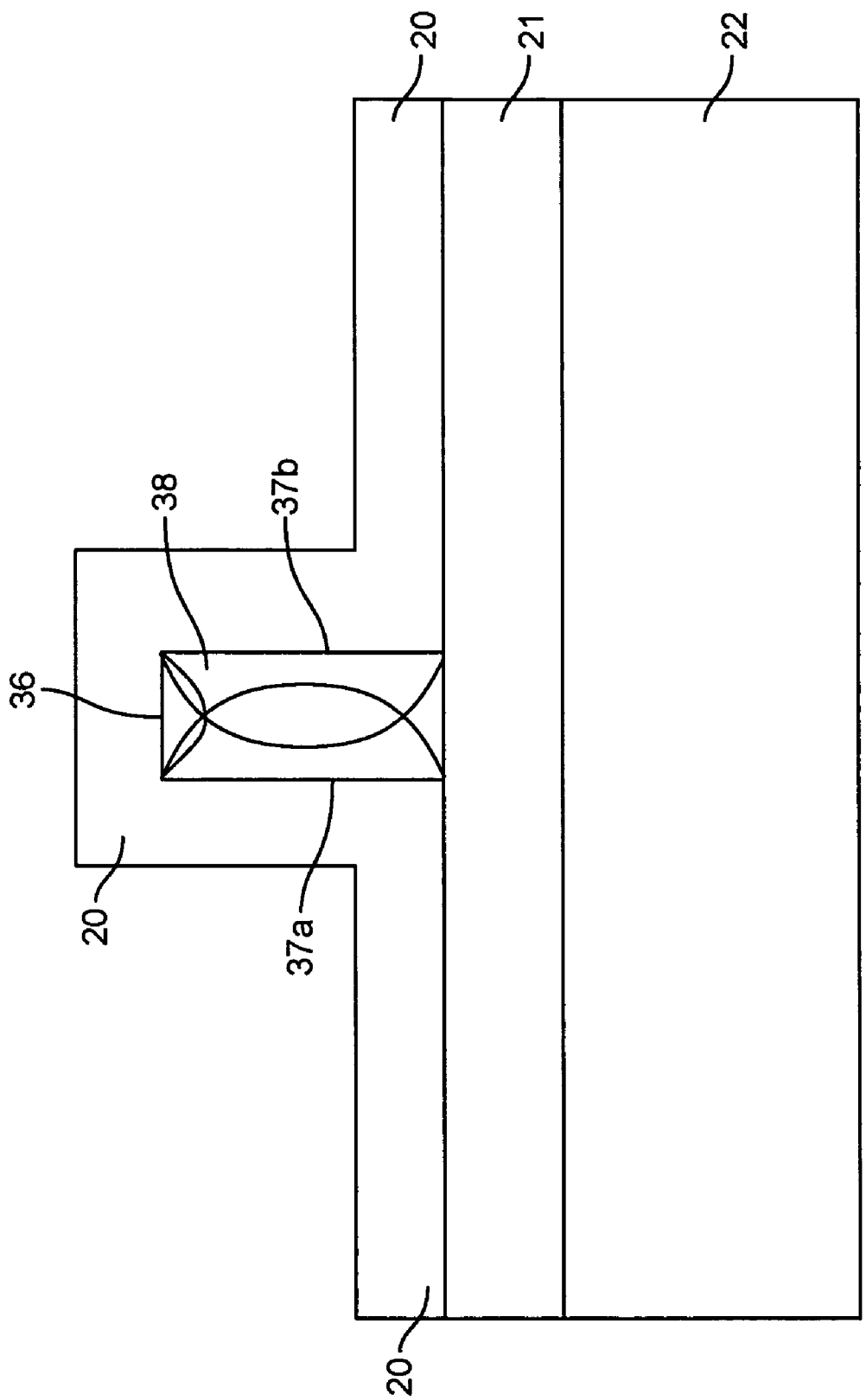
FIG. 15 is a cross-sectional depiction of a Tri-gate device that allows the channel to have further increased stress and carrier mobility in an FET with improved gate control of the channel.

FIG. 15 illustrates a narrow width channel FET, sometimes referred to as a FinFET, or Tri-gate device representing either the nFET or pFET of a CMOS pair. This geometry for the active Si region 38 has been of recent interest for high performance FETs at small size requirements and is particularly suited to enhancement in accordance with the present invention. In one embodiment, a device having the structure in which the gate 20 wraps around the active area 38 is used. The gate electrode 20 is reacted with a metal to form a stressed silicide (e.g. PdSi, $CoSi_{21}$, or NiSi) that covers the active Si region 38 on at least three sides. Again, the silicide locations may be regulated by deposition of silicon, possibly in several stages, (each) followed by a well-regulated thickness of metal and silicide formation by annealing at a well-regulated temperature. This structure results in stresses developed along both vertical portions of the Si 37a and 37b as well as the horizontal region of the Si 36. In this configuration, the strain induced in the channel by each side of the gate is additive significantly increased and the stress from each vertical and horizontal portion of the gate can enhance the carrier mobility for all three portions of the channel 37a, 37b, and 36.

In view of the foregoing, it is seen that the invention provides a method and structure for controlling or improving the carrier mobility in both nFETs and pFETs on the same chip without compromise of manufacturing yield or adverse effects on previously formed structures or later performed processes and which can be readily controlled without compromising manufacturing yield and requiring only a few additional but well-understood processes. Since compressive and tensile forces, although potentially substantial, are applied to relatively small respective areas (in comparison to chip thickness) there is no tendency of the chip or wafer to warp or curl primarily because tensile and compressive stress areas are interspersed and secondarily because stresses are applied only in the relatively small gate area coextensive with the channel. Further, since the addition of silicides does not add area to the transistors, but simply reengineers the materials therein in order to greatly enhance performance, the severity of the topography, the dimensional scale, and integration density are not altered or compromised. It should be appreciated that while an "improvement" in carrier mobility may generally connote an increase therein, a reduction in carrier mobility may be provided by the same process merely by exchanging the silicide material relative to the transistor types to thus reverse the types of tensile or compressive forces that are applied to respective transistor conduction/impurity types. Additionally, alternate materials can be used to further regulate the magnitude of the channel stresses. The order of silicide formation may also be changed between transistors since the processes are decoupled by masking.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of adjusting carrier mobility in semiconductor devices comprising the steps of
   depositing a metal or combination of metals to contact one of a first or second transistor gate structure, wherein said depositing step comprises
   depositing a first metal or combination of metals to a portion of gate electrode material in said first or second transistor structure to form an alloy at the lower region of the gate electrode proximate to the channel of said first or second transistor; and
   depositing a second metal or combination of metals over said first or second transistor gate electrode to form a first stressed alloy within said first or second transistor gate in the upper region of the gate electrode, and
   alloying said metal or combination of metals and said one of a first and second transistor gate structure to form at least said first stressed alloy within said one of a first or second transistor gate whereby a first stress is created in at least one corresponding channel of first or second transistors without producing a stress in a channel of the other transistor of said first or second transistors.

2. A method as recited in claim 1 wherein said depositing step further comprises
   depositing a metal or combination of metals to a portion of said gate electrode material in said other transistor of said first and second transistors to form an alloy at the lower region of the gate electrode proximate to the channel of said other transistor; and
   depositing a metal or combination of metals over said other transistor gate electrode to form a stressed alloy within said other transistor gate in the upper region of the gate electrode, and
   alloying said metal or combination of metals and said transistor gate structure to form at least a second stressed alloy within said transistor gate of said other transistor, whereby said second stressed alloy within said other transistor gate electrode creates a second stress in a channel area of said other transistor.

3. A method as recited in claim 2 wherein the first stressed alloy and second stressed alloy are of opposing stresses.

4. A method as recited in claim 3 wherein the first transistor and second transistor are of opposite conductivity types.

5. A method as recited in claim 4 wherein
   said first transistor is an nFET wherein said first stressed alloy is compressive creating said first stress wherein first stress is tensile, and
   said second transistor is a pEET wherein said second stressed alloy is tensile creating said second stress wherein second stress is compressive.

* * * * *